United States Patent [19]
Yasuoka

[11] 4,435,787
[45] Mar. 6, 1984

[54] SEMICONDUCTOR MEMORY CIRCUIT
[75] Inventor: Nobuyuki Yasuoka, Tokyo, Japan
[73] Assignee: Nippon Electric Co., Ltd., Tokyo, Japan
[21] Appl. No.: 312,106
[22] Filed: Oct. 16, 1981
[30] Foreign Application Priority Data
  Oct. 21, 1980 [JP]  Japan ................ 55-147142
[51] Int. Cl.³ .......................... G11C 11/40
[52] U.S. Cl. ...................... 365/174; 365/190
[58] Field of Search ............ 365/174, 189, 190
[56]         References Cited
      U.S. PATENT DOCUMENTS
  3,889,287  6/1975  Powell ................ 365/174 X
          OTHER PUBLICATIONS
"Semiconductor Memories", Digest of Technical Papers, pp. 40-41, Wed., Feb. 19, 1969, 1969 IEEE International Solid State Conference.

*Primary Examiner*—Joseph A. Popek
*Attorney, Agent, or Firm*—Blakely, Sokoloff, Taylor & Zafman

[57]         ABSTRACT

A semiconductor memory circuit is described for use in a memory array which is capable of permitting data contained in an entire column or in an entire row to be accessed simultaneously. The invented device improves upon the traditional memory circuit, which uses a single word line and two digit lines, by adding a second word line and a third digit line coupled through the gate and drain, respectively, of a transistor device. In a preferred embodiment, all the second word lines of each column are coupled in common to form a common second word line for each column, and all the third digit lines of each row are coupled in common to form a common third digit line for each row. When a signal of a high potential is coupled to the common second word line for a particular column, all the data contained in the memory circuits of that column appears on the common third digit lines.

6 Claims, 16 Drawing Figures

SEMICONDUCTOR MEMORY CIRCUIT

BACKGROUND OF THE INVENTION

This invention relates to a MOS (metal oxide film semiconductor) memory circuit, and more particularly to a memory circuit being capable of converting the matrix of a memory array and suitable for the processing of character patterns and graphic patterns.

Although the following description will be made with respect to an N-channel MOS memory circuit, it is self-evident that the description will be likewise applicable to a P-channel MOS memory circuit.

A typical conventional memory circuit is illustrated in FIG. 1. In the memory circuit of FIG. 1, one terminal of each of loads 11 and 12 is connected to a power source 104, the other terminal of the load 11 is connected to the source terminal of a transfer transistor 13, the drain terminal of a driver transistor 15 and the gate terminal of a driver transistor 16, the other terminal of the load 12 is connected to the source terminal of a transfer transistor 14, the gate terminal of the driver transistor 15 and the drain terminal of the driver transistor 16, the source terminals of the driver transistors 15, 16 are connected to a grounding conductor 105, the drain terminals of the transfer transistors 13, 14 are respectively connected to digit lines 102 and 103, and the gate terminals thereof are connected in common to a word line 101.

The operation of this memory circuit will be described with reference to FIG. 2 and FIG. 3. Write operation is effected by applying a high level signal to the word line 101 and applying a low level signal to either the digit line 102 or 103 as illustrated in FIG. 2. Similarly to the write operation, read operation is executed by applying a high level signal to the word line 101 thereby causing one of the digit lines 102 and 103 to sense a signal corresponding to the written signal as illustrated in FIG. 3.

A typical memory array consisting of 4 words×4 bits and using the conventional memory circuit is illustrated in FIG. 4. In FIG. 4, CWA1, CWA2, CWA3, and CWA4 denote word lines, CDA1, $\overline{CDA1}$ (inversion of CDA1), CDA2, $\overline{CDA2}$, CDA3, $\overline{CDA3}$, CDA4, and $\overline{CDA4}$ denote digit lines, and Cij (i=1 to 4, j32 1 to 4) denotes the memory circuit illustrated in FIG. 1. Writing data in the memory circuit C11, C12, C13, or C14 is executed by applying a high level signal to the word line CWA1 and applying a high level or low level signal to the data line CDAi or $\overline{CDAi}$ (i=1 to 4). Reading data from the memory circuit is effected by applying a high level to the word line CEA1 and sensing a signal developing on the digit line CDAi or $\overline{CDAi}$ (i=1 to 4). As is evident from FIG. 4, the data of the memory circuits in row selected by the word line CWAi (i=1 to 4) appear on the digit line CDAi or $\overline{CDAi}$ (i=1 to 4) but the data of the memory circuits in column Ci1, Ci2, Ci3, or Ci4 (i=1 to 4) cannot be read out all at once. This means that the conventional memory array is incapable of matrix conversion.

SUMMARY OF THE INVENTION

This invention intends to eliminate drawbacks of the conventional memory circuit array and has for its object to provide an improved semiconductor memory circuit capable of the matrix conversion in a memory circuit array.

According to the invention, there is provided a semiconductor memory circuit comprising: first and second loads having each one end connected to a power source terminal; a first transistor having a source terminal connected to the other end of the first load, a drain terminal connected to a first digit line and a gate terminal connected to a first word line; a second transistor having a source terminal connected to the other end of the second load, a drain terminal connected to a second digit line and a gate terminal connected to the first word line; a third transistor having a drain terminal connected to the other end of the first load and a gate terminal connected to the other end of the second load; and a fourth transistor having a gate terminal connected to the other end of the first load and a drain terminal connected to the other end of the second load, characterized by means for associating a third digit line and a second word line with the source terminal of at least one of the first and second transistors.

DESCRIPTION OF THE PREFERRED EMBODIMENTS

Figure 5:
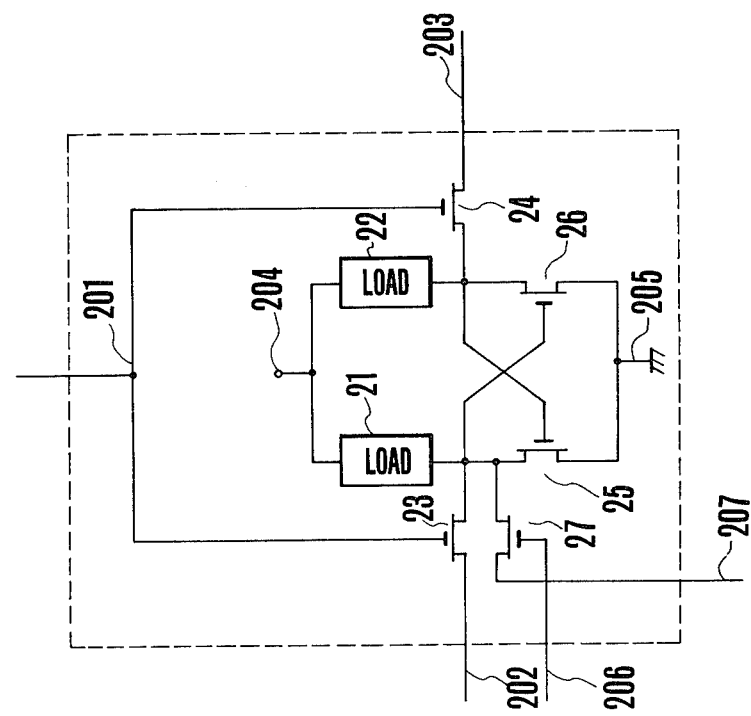
FIG. 5 is a circuit diagram illustrating a memory circuit embodying the present invention.

Referring to FIG. 5, there is shown a preferred embodiment of a semiconductor memory circuit according to the invention. The semiconductor memory circuit comprises first and second loads 21 and 22 having each one end connected to a power source terminal 204, a first transistor 23 having a source terminal connected to the other end of the first load 21, a drain terminal connected to a first digit line 202 and a gate terminal connected to a first word line 201, a second transistor 24 having a source terminal connected to the other end of the second load 22, a drain terminal connected to a second digit line 203 and a gate terminal connected to the first word line 201, a third transistor 25 having a drain terminal connected to the other end of the first load 21 and a gate terminal connected to the other end of the second load 22, and a fourth transistor 26 having a gate terminal connected to the other end of the first load 21 and a drain terminal connected to the other end of the second load 22. The source terminals of the third and fourth transistors 25 and 26 are grounded by means of a line 205. The above construction is the same as the conventional circuit of FIG. 1. The semiconductor memory circuit of FIG. 5 also comprises a fifth transistor 27 having a drain terminal connected to a third digit line 207, a gate terminal connected to a second word line 206 and a source terminal connected to the source terminal of the first transistor 23. Thus, the third digit line 207 and second word line 206 are associated with the source terminal of the first transistor 23 by means of the fifth transistor 27.

Now, the operation of the memory of this invention will be described.

Figure 1:
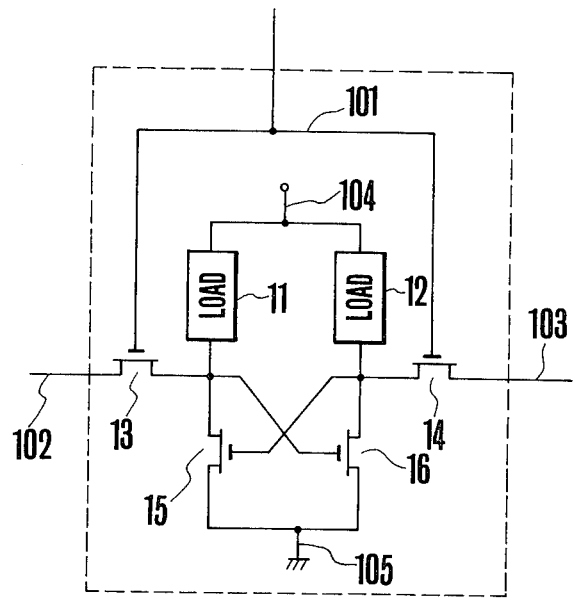
FIG. 1 is a circuit diagram representing a typical conventional memory circuit.

Similarly to the conventional memory circuit of FIG. 1, write operation is executed by applying a high level signal to the first word line 201 and applying a low level signal to either the digit line 202 or 203. In this case, the second word line 206 remains in its low level. Read operation is effected in two ways. In one mode, the operation is executed by applying a high level signal to the first word line 201 and sensing the data which consequently issue on either the digit line 202 or 203 in much the same way as in the conventional memory circuit of FIG. 1. In this case, the second word line 206 remains in its low level. In the other mode, the operation is performed by allowing the first word line 201 to remain in its low level, applying a high level signal to the second word line 206, and sensing the data which issue on the digit line 207.

Figure 6:
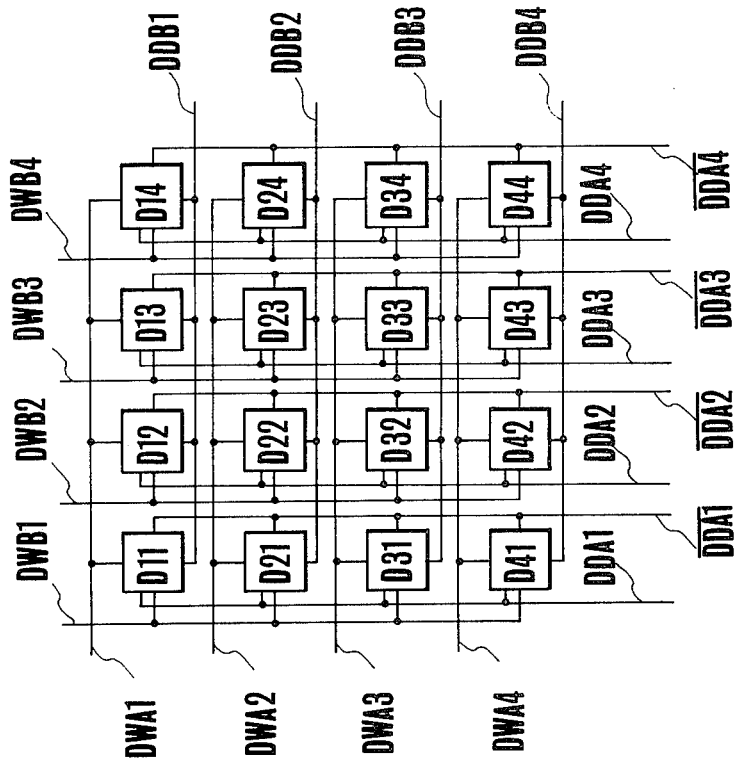
FIG. 6 is a block digram of a memory array of 4 words×4 bits using the memory circuits of FIG. 5.

A memory array of 4 words×4 bits using the memory circuits of FIG. 5 is illustrated in FIG. 6. In FIG. 6, the FIG. 5 memory circuits of the present invention are denoted by Dij (i=1 to 4, j=1 to 4), the second word line 206 by DWBi (i=1 to 4), the first digit line 202 by DDAi (i=1 to 4), the second digit line 203 by $\overline{\text{DDAi}}$ (i=1 to 4), and the third digit line 207 by DDBi (i=1 to 4).

More particularly, the semiconductor memory array of FIG. 6 has a plurality of semiconductor memory circuits Dij in matrix arrangement. Each of the memory circuits has the construction of FIG. 5. Respective memory circuits on each row of the matrix arrangement have the first word lines 201 connected in common to form the first word line DWAi of the array. Respective memory circuits on each column have the first digit lines 202 connected in common to from the first digit line DDAi of the array, the second digit lines 203 connected in common to form the second digit line $\overline{\text{DDAi}}$ of the array, and second word lines 206 connected in common to form the second word line DWBi of the array. The third digit lines 207 of the respective memory circuits on each row are connected in common to form the third digit line DDBi of the array.

In the memory array of FIG. 6, reading data of the memory circuits D11, D12, D13 and D14 in row is executed by applying a high level signal to the first word line DWA1 and sensing the data which issue on the digit line DDAi or $\overline{\text{DDAi}}$. During this operation, the other word lines remain in their low level. Then reading the data of the memory circuits D11, D21, D31 and D41 in column is executed by applying a high level signal to the second word line DWB1 and sensing the data which issue on the digit line DDBi.

As described above, a memory array capable of matrix conversion can be materialized by using the memory circuits of the present invention. Thus, the present invention brings about advantageous effects.

The memory circuits of the present invention can be applied to the processing of images such as character patterns and graphic patterns.

Figure 7:
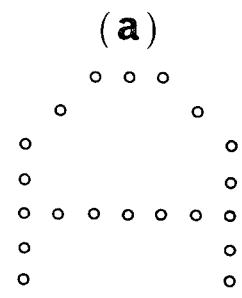
FIG. 7, consisting of a and b, is a diagram illustrating a character to be processed by the memory circuit of the present invention.
Figure 2:
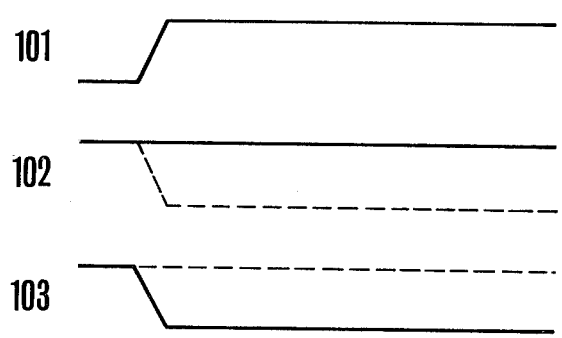
FIG. 2 and FIG. 3 are diagrams illustrating waveforms in write and read operations performed in the circuit of FIG. 1.
Figure 3:
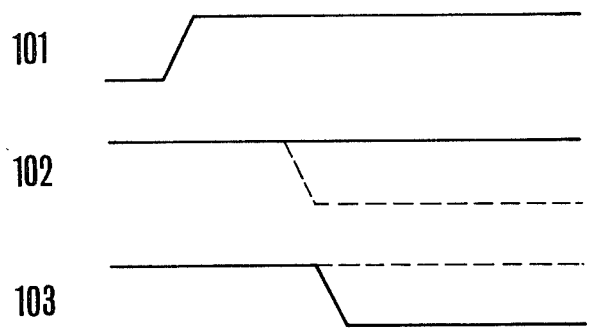
Figure 4:
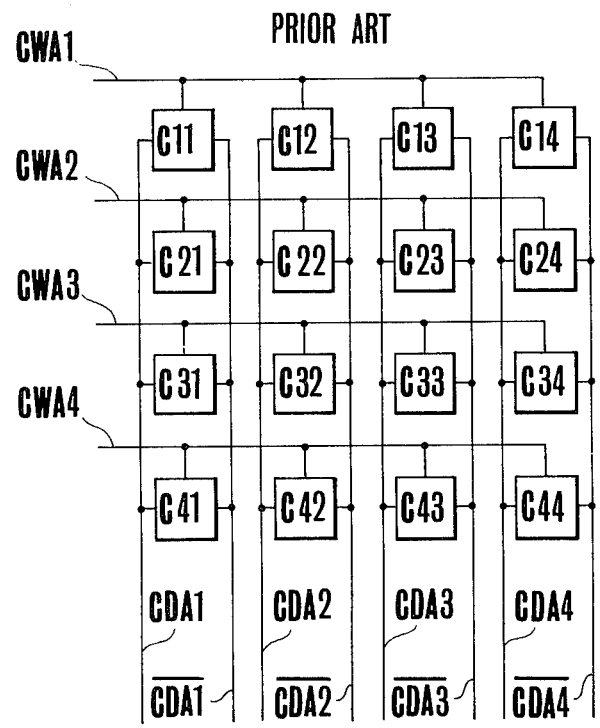
FIG. 4 is a block diagram of a memory array of 4 words×4 bits using the conventional memory circuits of FIG. 1.

In the operation of image processing, when a character such as illustrated in section (a) in FIG. 7 is required to have its direction rotated by 90° on the screen to obtain a character A in section (b) in FIG. 7, the conventional memory array has accomplished the angular rotation of the character by first reading a character string of the character in section (a) from the memory and writing the character string into a shift register, for example, rearranging the character string, and thereafter rotating the rearranged character string to obtain the character as illustrated in section (b). By the employment of the memory circuit of the present invention, however, the character in section (b) can be directly obtained from that in section (a). Thus, the present invention readily realizes high-speed processing of image data.

Figure 9:
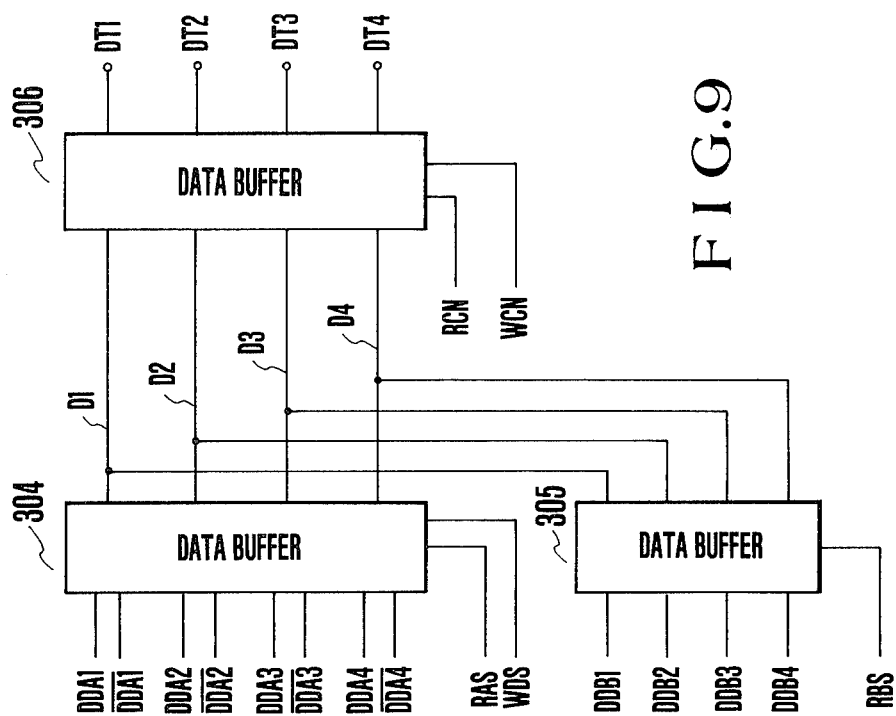
FIG. 9 is a block diagram illustrating a digit system in the memory array of FIG. 6.
Figure 8:
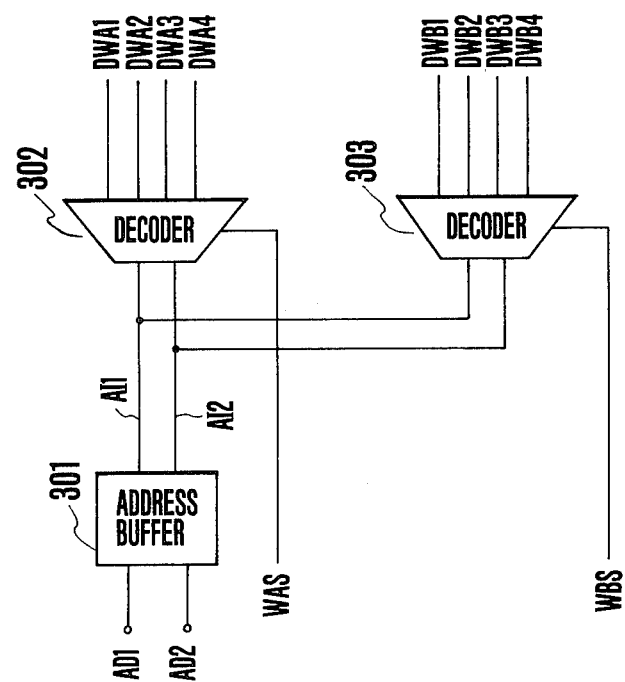
FIG. 8 is a block diagram illustrating a word system in the memory array of FIG. 6.

A typical configuration of circuits for the word system of $\overline{\text{DWAi}}$ (i=1 to 4) and DWBi (i=1 to 4) in the memory array of FIG. 6 is illustrated in FIG. 8, and a typical configuration of circuits for the digit system of DDAi (i=1 to 4), $\overline{\text{DDAi}}$ (i=1 to 4), and DDBi (i=1 to 4) in the same memory array is illustrated in FIG. 9.

The word system of FIG. 8 includes external address terminals AD1, AD2, an address buffer circuit 301, a first decode circuit 302, a second decode circuit 303, output lines AI1, AI2 of the address buffer circuit 301, control lines WAS, WBS of the first and second decode circuits, and output lines DWAi (i=1 to 4) and DWBi (i=1 to 4) of the first and second decode circuits.

The digit system of FIG. 9 includes a first data buffer circuit 304, a second data buffer circuit 305, a third data buffer circuit 306, input signal lines DDAi (i=1 to 4) and $\overline{\text{DDAi}}$ (i=1 to 4) of the first data buffer circuit, control signal lines RAS and WDS of the first buffer circuit, an input signal line DDBi (i=1 to 4) of the second data buffer circuit, a control signal line RBS of the second data buffer circuit, an output signal line Di (i=1 to 4) of the second data buffer circuit, a write signal control line WCN of the third data buffer circuit, a read signal control line RCN of the third data buffer circuit, a read signal control line RCN of the third data buffer circuit, and an external data input-output terminal DTi (i=1 to 4).

Figure 10:
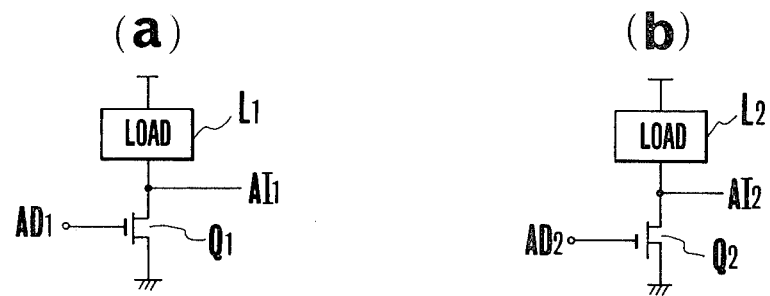
FIG. 10, consisting of a and b, is a diagram illustrating an address buffer circuit in the diagram of FIG. 8.

A typical configuration of the address buffer circuit 301 in the diagram of FIG. 8 is illustrated in FIG. 10. A typical configuration of the first and second decode circuits 302, 303 in the same diagram is illustrated in FIG. 11.

The address buffer circuit of FIG. 10 includes load elements L1, L2, transistors Q1, Q2, external input signal terminals AD1, AD2, and output signal lines AI1, AI2.

Figure 11:
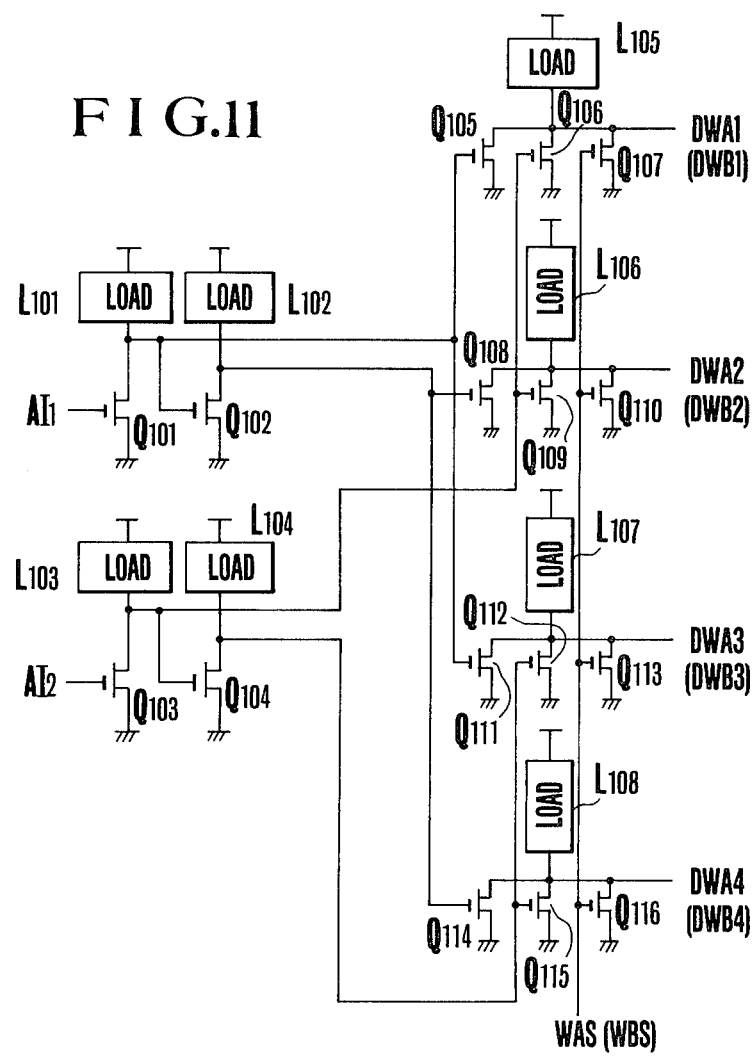
FIG. 11 is a circuit diagram illustrating a configuration of first and second decode circuits in the diagram of FIG. 8.

The decode circuit 302 or 303 includes as illustrated in FIG. 11 load elements L10 to L109, transistors Q101 to Q116, and signal lines AI1, Aj2, DWAi (i=1 to 4), DWBi (i=1 to 4), WAS, and WBS.

Figure 12:
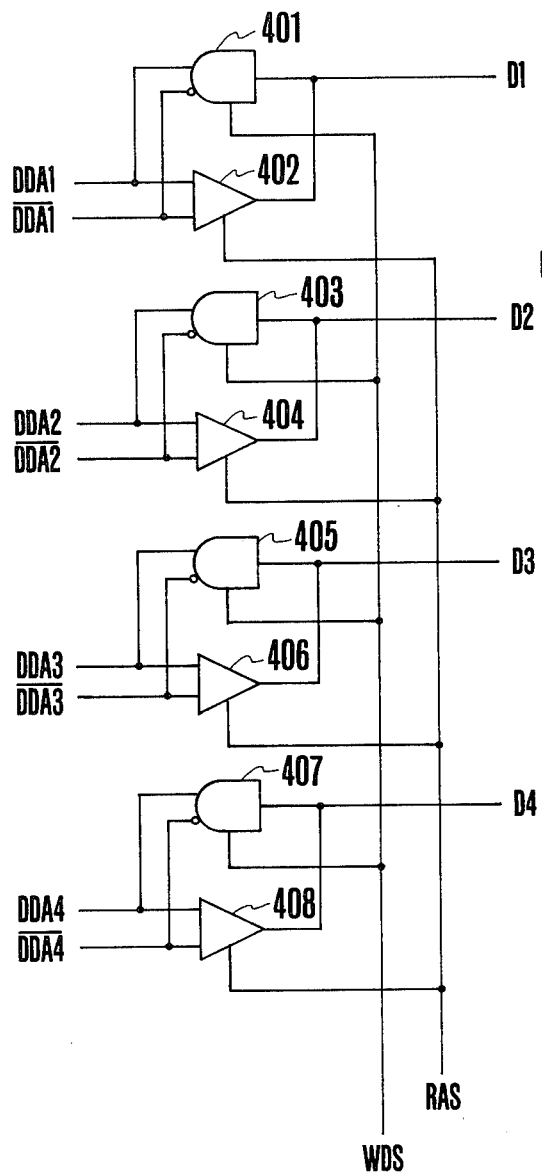
FIGS. 12, 13, and 14 are diagrams each illustrating a configuration of first, second, and third data buffer circuits in the diagram of FIG. 9.
Figure 13:
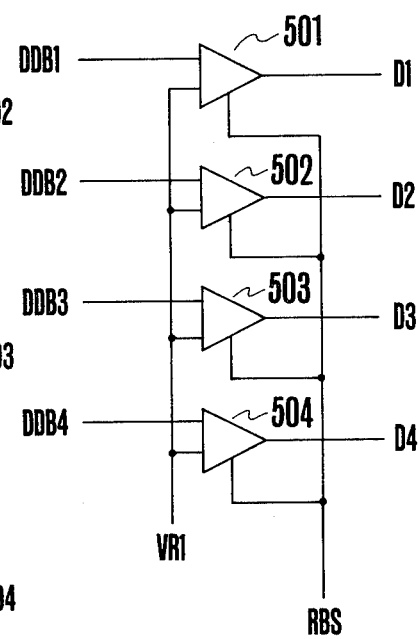
Figure 14:
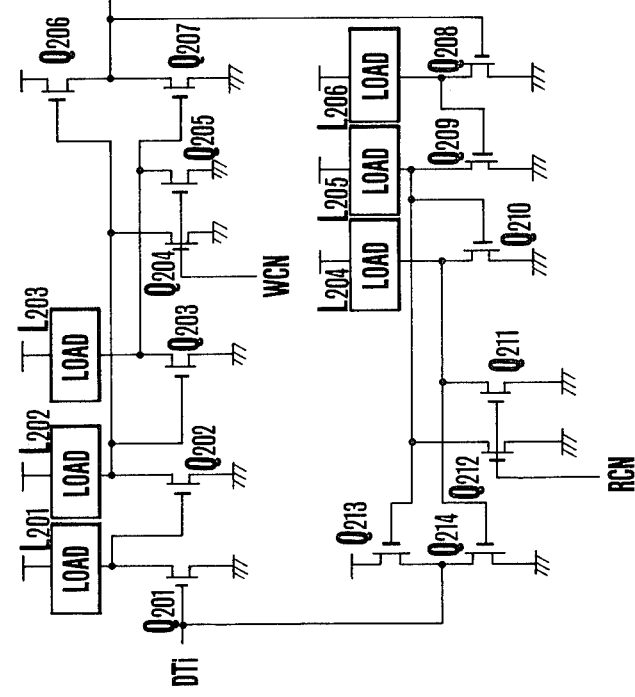

A typical configuration of the first data buffer circuit 304 in the diagram of FIG. 9 is illustrated in FIG. 12, a typical configuration of the second data buffer circuit 305 in the same diagram is illustrated in FIG. 13, and a typical configuration of the third data buffer circuit 306 in the same diagram is illustrated in FIG. 14.

The data buffer circuit of FIG. 12 includes write data circuits 401 to 404, read data circuits 405 to 408, and signal lines DDAi (i=1 to 4), $\overline{\text{DDAi}}$ (i=1 to 4), Di (i=1 to 4), RAS, and WDS.

The data buffer circuit of FIG. 13 includes read data circuits 501 to 504, a read data reference signal line VR1, and signal lines DDBi (i=1 to 4), Di (i=1 to 4), and RBS.

The data buffer circuit of FIG. 14 is includes load elements L201 to L206, transistors Q201 to Q214, and signal lines DTi (i=1 to 4), Di (i=1 to 4), WCN, and RCN.

Figure 15:
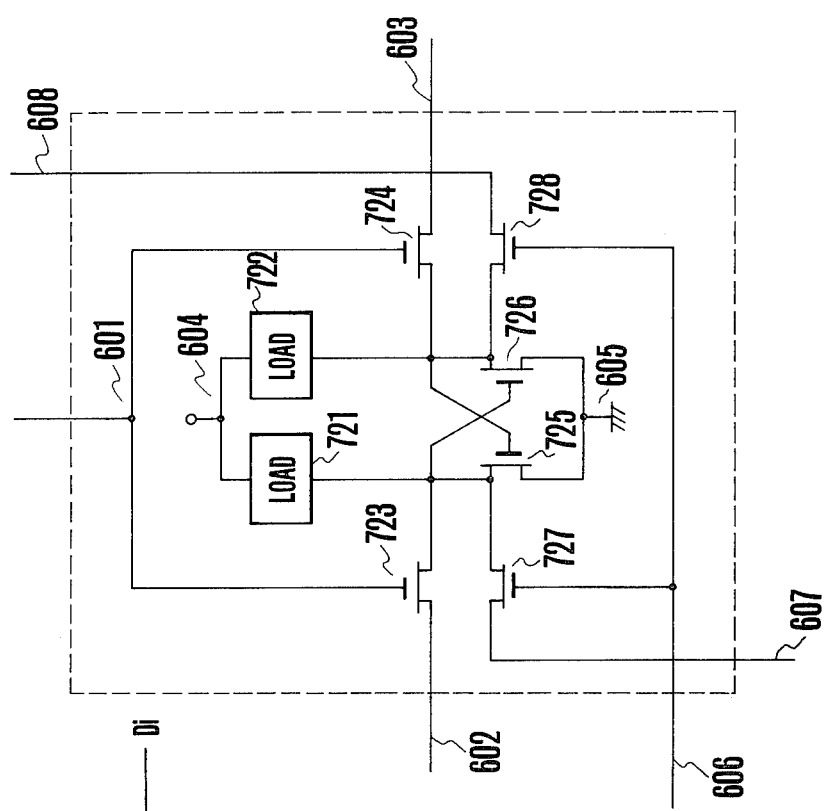
FIG. 15 is a circuit diagram illustrating another embodiment of a memory circuit according to the present invention.

Another preferred embodiment of the memory circuit according to the present invention is illustrated in FIG. 15. A memory array of 4 words×4 bits using the memory circuits of FIG. 15 is illustrated in FIG. 16.

In the embodiment of FIG. 15, lines 601, 602, 603, 605, and 607 and a terminal 604 correspond respectively to the lines 201, 202, 203, 205, and 207 and the terminal 204 of the embodiment of FIG. 5, and loads 721 and 722 and transistors 723 to 727 correspond to the loads 21, 22 and the transistors 23 to 27. Specifically, in order to provide the inversion of the third digit line of the FIG. 5 embodiment, a sixth transistor 728 is added which has a source terminal connected to the source terminal of the second transistor 724, a drain terminal connected to a fourth digit line 608 and a gate terminal connected, in common with the gate terminal of the fifth transistor, to the second word line.

Figure 16:
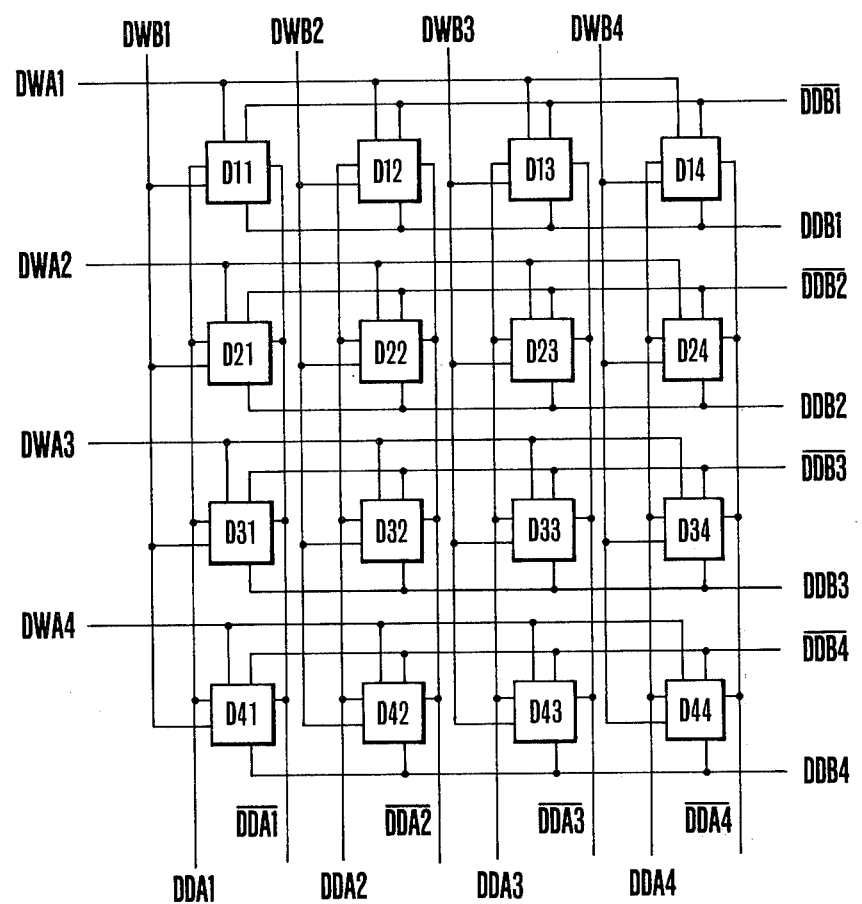
FIG. 16 is a block diagram of a memory array of 4 words×4 bits using the memory circuits of FIG. 15.

The embodiment of FIG. 16 represents an expansion of the embodiment of FIG. 6 by the incorporation of fourth digit line $\overline{\text{DDBi}}$ (i=1 to 4) of the array which corresponds to the signal line 608 of the embodiment of FIG. 15.

What is claimed is:

1. In a semiconductor memory circuit comprising:
   a first load having a first and second terminal and a second load having a first and second terminal with said first terminals of said first and second loads coupled to a power source;
   a first transistor having a source terminal coupled to said second terminal of said first load, a drain terminal coupled to a first digit line and a gate terminal coupled to a first word line;
   a second transistor having a source terminal coupled to said second terminal of said second load, a drain terminal coupled to a second digit line and a gate terminal coupled to the first word line;
   a third transistor having a drain terminal coupled to said second terminal of said first load, a source terminal coupled to a point at a predetermined potential, and a gate terminal coupled to said second terminal of said second load; and
   a fourth transistor having a gate terminal coupled to said second terminal of said first load, a source terminal coupled to a point at a predetermined potential, and a drain terminal coupled to said second terminal of said second load;
   the improvement which comprises a means for selectively coupling both a third digit line and a second word line to the source terminal of at least one of said first and second transistors.

2. A semiconductor memory circuit as recited in claim 1 wherein said means selectively couples said third digit line and said second word line to the source terminals of said first and second transistors.

3. A semiconductor memory circuit as recited in claim 1 wherein said means further comprises a fifth transistor having a drain terminal coupled to said third digit line, a gate terminal coupled to said second word line and a source terminal coupled to said source terminal of said first transistor.

4. A semiconductor memory array having a plurality of semiconductor memory circuits in matrix arrangement, respective memory circuits on each row of the matrix arrangement having first word lines connected in common to form a common first word line for each said row of the array, respective memory circuits on each column having first digit lines connected in common to form a common first digit line for each said column of the array, second digit lines connected in common to form a common second digit line for each said column of the array, second word lines connected in common to form a common second word line for each said column of the array, and third digit lines of the respective memory circuits on each row being connected in common to form a common third digit line for each said row of the array; whereby
   coupling a signal of a first potential to a given first word line permits data contained in the memory circuit coupled to said first word line to be sampled at the first and second digit lines coupled to said memory circuit, and coupling a signal of a second potential to a given second word line permits data contained in each memory circuit of the column of memory circuits coupled to said second word line to be sampled at the third digit line coupled to each said memory circuit of said column.

5. A semiconductor memory array as recited in claim 4 further comprising a means for providing the logical compliment of signals appearing on said common third digit lines.

6. A semiconductor memory array having a plurality of memory circuits wherein each said memory circuit comprises:
   a memory cell;
   a first word line coupled to said memory cell;
   a first digit line coupled to said memory cell for receiving data from said memory cell when a signal of a first potential is coupled to said first word line;
   a second word line coupled to said memory cell and extending from said memory cell in a direction perpendicular to said first word line; and
   a second digit line coupled to said memory cell and extending from said memory cell in a direction perpendicular to said first digit line, for receiving data when a signal of a second potential is coupled to said second word line; whereby an array of memory circuits is realized having first word lines crossing second word lines at right angles, and first digit lines crossing second digit lines at right angles.

* * * * *